(12) United States Patent
Kobrin et al.

(10) Patent No.: US 9,782,917 B2
(45) Date of Patent: Oct. 10, 2017

(54) CYLINDRICAL MASTER MOLD AND METHOD OF FABRICATION

(71) Applicants: Boris Kobrin, Dublin, CA (US); Ian McMackin, Austin, TX (US)

(72) Inventors: Boris Kobrin, Dublin, CA (US); Ian McMackin, Austin, TX (US)

(73) Assignee: METAMATERIAL TECHNOLOGIES USA, INC., Pleasanton, CA (US)

( * ) Notice: Subject to any disclaimer, the term of this patent is extended or adjusted under 35 U.S.C. 154(b) by 690 days.

(21) Appl. No.: 13/756,348

(22) Filed: Jan. 31, 2013

(65) Prior Publication Data

US 2014/0212533 A1    Jul. 31, 2014

(51) Int. Cl.
B29C 33/38     (2006.01)
G03F 1/70      (2012.01)
G03F 7/00      (2006.01)

(52) U.S. Cl.
CPC .......... *B29C 33/38* (2013.01); *B29C 33/3842* (2013.01); *G03F 7/0002* (2013.01);
(Continued)

(58) Field of Classification Search
CPC ............ B29C 33/3842; B29C 33/3857; B29C 33/3878; B29C 33/3885; B29C 33/38; G03F 7/0002; G03F 1/70; G03F 7/0005
(Continued)

(56) References Cited

U.S. PATENT DOCUMENTS 3,320,344 A    5/1967  Slipp
3,515,798 A    6/1970  Sievert
(Continued)

FOREIGN PATENT DOCUMENTS

CN    100398304      7/2008
RU    2157763 C2    10/2000
(Continued)

OTHER PUBLICATIONS

Final Office Action for U.S. Appl. No. 13/756,370, dated Jul. 6, 2015.
(Continued)

*Primary Examiner* — Seyed Masoud Malekzadeh
(74) *Attorney, Agent, or Firm* — JDI Patent; Joshua D. Isenberg; Robert A. Pullman

(57) ABSTRACT

Aspects of the present disclosure describe cylindrical molds that may be used to produce cylindrical masks for use in lithography. A structured porous layer may be deposited on an interior surface of a cylinder. A radiation-sensitive material may be deposited over the porous layer in order to fill pores formed in the layer. The radiation-sensitive material in the pores may be cured by exposing the cylinder with a light source. The uncured resist and porous layer may be removed, leaving behind posts on the cylinder's interior surface. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

15 Claims, 5 Drawing Sheets

(52) U.S. Cl.
CPC ...... *B29C 33/3857* (2013.01); *B29C 33/3878* (2013.01); *B29C 33/3885* (2013.01); *G03F 1/70* (2013.01); *G03F 7/0005* (2013.01)

(58) Field of Classification Search
USPC ........ 264/219, 220, 221, 224, 225, 226, 227
See application file for complete search history.

(56) References Cited

U.S. PATENT DOCUMENTS

| | | | |
|---|---|---|---|
| 3,520,509 A | | 7/1970 | Carey |
| 3,619,446 A | * | 11/1971 | Nauta .................. B29C 33/405 101/28 |
| 3,622,117 A | | 11/1971 | Biagioni et al. |
| 4,035,534 A | | 7/1977 | Nyberg |
| 4,070,749 A | | 1/1978 | Misono et al. |
| 4,179,320 A | | 12/1979 | Midgley et al. |
| 4,294,782 A | * | 10/1981 | Froehlig ................. B29C 35/10 264/1.38 |
| 4,338,970 A | | 7/1982 | Krackeler et al. |
| 4,919,608 A | | 4/1990 | Catalanotti et al. |
| 5,252,279 A | * | 10/1993 | Gore .................... B29C 70/545 264/154 |
| 5,406,871 A | * | 4/1995 | Lambert, Jr. ......... B29C 61/065 138/103 |
| 5,746,253 A | * | 5/1998 | Dust .................. B29C 45/0046 138/137 |
| 5,888,701 A | | 3/1999 | Fan |
| 6,675,863 B1 | | 1/2004 | Wang et al. |
| 7,700,199 B2 | | 4/2010 | Wang et al. |
| 8,182,982 B2 | | 5/2012 | Kobrin |
| 8,192,920 B2 | | 6/2012 | Kobrin |
| 8,318,386 B2 | | 11/2012 | Kobrin |
| 8,334,217 B2 | | 12/2012 | Kobrin |
| 8,425,789 B2 | | 4/2013 | Kobrin |
| 8,518,633 B2 | | 8/2013 | Kobrin et al. |
| 2005/0015046 A1 | | 1/2005 | Weber et al. |
| 2005/0067286 A1 | * | 3/2005 | Ahn ........................ C25D 1/10 205/70 |
| 2007/0264481 A1 | * | 11/2007 | DeSimone .......... A61K 9/5138 428/220 |
| 2008/0054517 A1 | | 3/2008 | Yamamoto |
| 2009/0087599 A1 | | 4/2009 | Cheng et al. |
| 2009/0166932 A1 | | 7/2009 | Lee et al. |
| 2009/0220789 A1 | * | 9/2009 | DeSimone ............. B82Y 10/00 428/402 |
| 2009/0269705 A1 | | 10/2009 | Kobrin |
| 2010/0035163 A1 | * | 2/2010 | Kobrin ..................... G03B 9/10 430/2 |
| 2010/0123885 A1 | * | 5/2010 | Kobrin .................. G03B 27/42 355/53 |
| 2010/0294421 A1 | | 11/2010 | Fujiki et al. |
| 2011/0182805 A1 | * | 7/2011 | DeSimone ........... A61K 9/0097 424/1.11 |
| 2011/0210480 A1 | | 9/2011 | Kobrin |
| 2012/0274004 A1 | | 11/2012 | Kobrin |
| 2012/0282554 A1 | | 11/2012 | Kobrin et al. |
| 2013/0224636 A1 | | 8/2013 | Kobrin |
| 2013/0280894 A1 | | 10/2013 | Lee et al. |
| 2014/0212536 A1 | | 7/2014 | Kobrin et al. |

FOREIGN PATENT DOCUMENTS

| | | |
|---|---|---|
| WO | 2009094009 A | 7/2009 |
| WO | 2012027050 A | 3/2012 |

OTHER PUBLICATIONS

Non-Final Office Action for U.S. Appl. No. 13/756,370, dated Jan. 2, 2015.
U.S. Appl. No. 61/641,711, to Boris Kobrin et al., filed May 2, 2012.
U.S. Appl. No. 61/798,629, to Boris Kobrin, filed Mar. 15, 2013.
International Search Report and Written Opinion of the International Searching Authority for Application No. PCT/US2013/038675 dated Aug. 29, 2013.
U.S. Appl. No. 13/756,370 entitled "Cylindrical Master Mold Assembly for Casting Cylindrical Masks", to Boris Kobrin. filed Jan. 31, 2013.
Non-Final Office Action for U.S. Appl. No. 14/521,375, dated May 3, 2016.
Notice of Allowance from U.S. Appl. No. 13/756,370, dated Jul. 1, 2016.
Chinese Office Action for CN Application No. 201380035462.0, dated Feb. 1, 2016.
Non-Final Office Action for U.S. Appl. No. 13/756,370, dated Mar. 10, 2016.
Final Office Action for U.S. Appl. No. 14/521,375, dated Nov. 28, 2016.

* cited by examiner

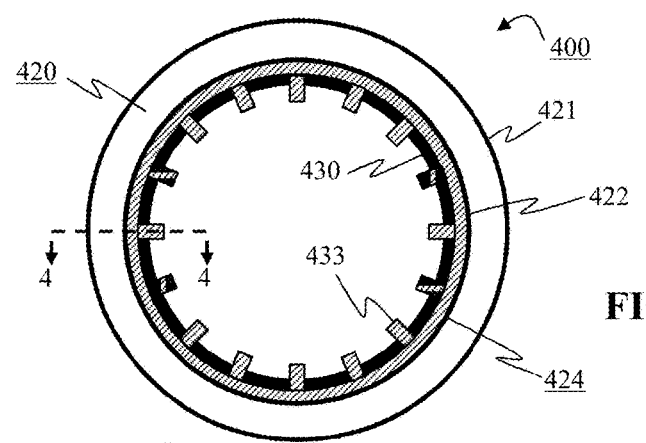
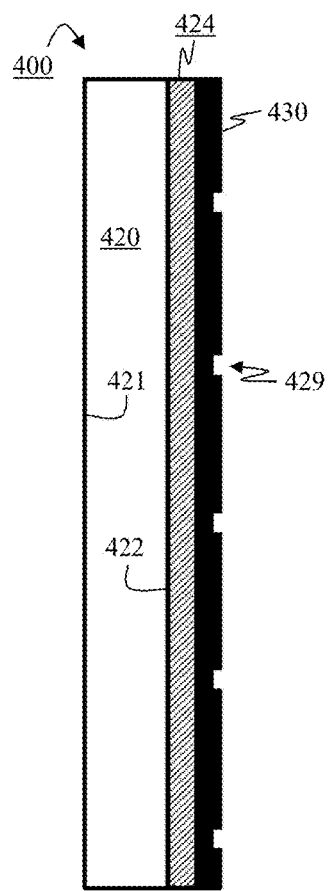 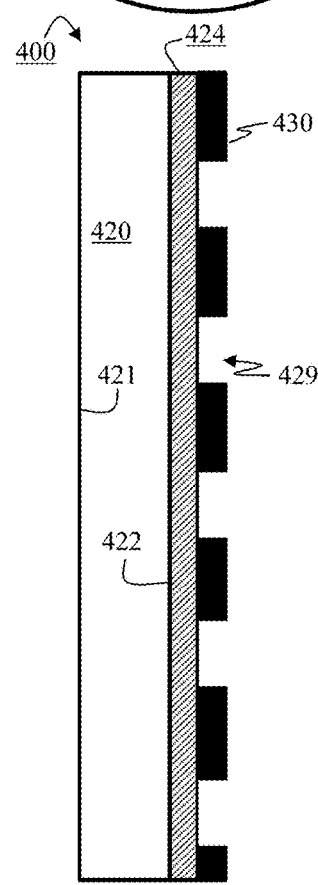 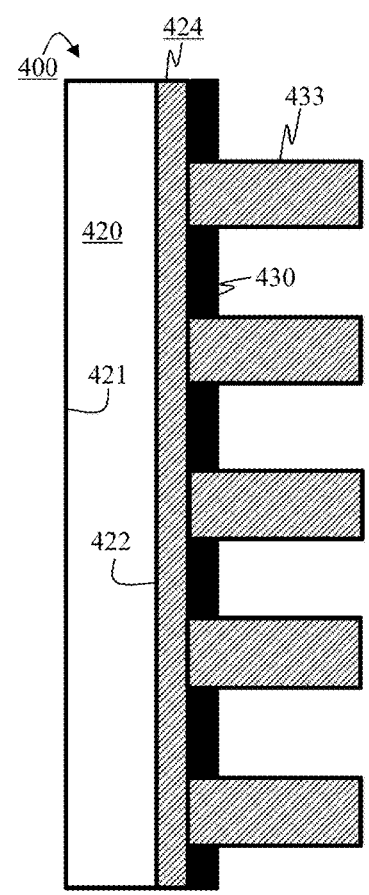
FIG. 4B    FIG. 4C    FIG. 4D

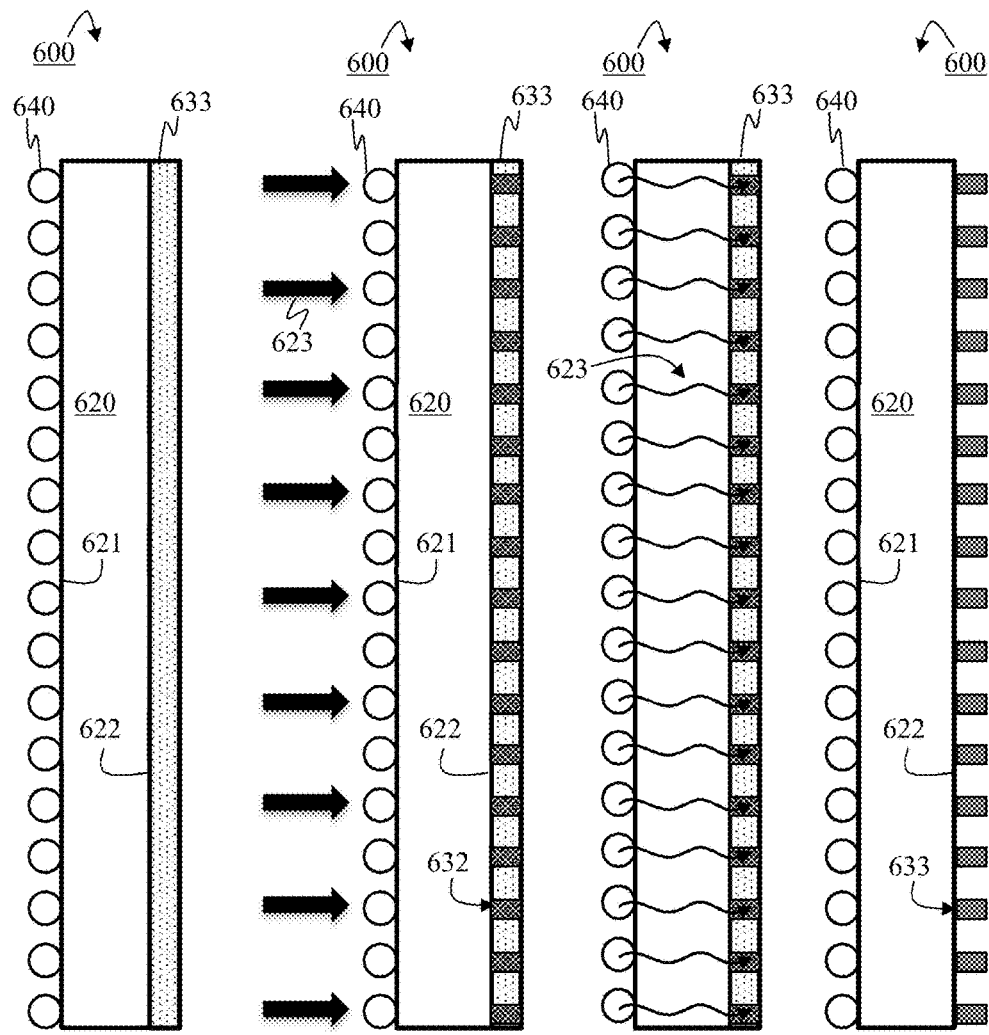

CYLINDRICAL MASTER MOLD AND METHOD OF FABRICATION

FIELD OF THE INVENTION

Aspects of the present disclosure relate to a master mold for use in the manufacture a lithography mask and methods for manufacturing the same.

BACKGROUND

This section describes background subject matter related to the disclosed embodiments of the present invention. There is no intention, either express or implied, that the background art discussed in this section legally constitutes prior art.

Nanostructuring is necessary for many present applications and industries and for new technologies and future advanced products. Improvements in efficiency can be achieved for current applications in areas such as solar cells and LEDs, and in next generation data storage devices, for example and not by way of limitation.

Nanostructured substrates may be fabricated using techniques such as e-beam direct writing, Deep UV lithography, nanosphere lithography, nanoimprint lithography, near-field phase shift lithography, and plasmonic lithography, for example.

Earlier authors have suggested a method of nanopatterning large areas of rigid and flexible substrate materials based on near-field optical lithography described in International Patent Application Publication No. WO2009094009 and U.S. Pat. No. 8,182,982, which are both incorporated herein in their entirety. According to such methods, a rotatable mask is used to image a radiation-sensitive material. Typically the rotatable mask comprises a cylinder or cone with a mask pattern formed on its surface. The mask rolls with respect to the radiation sensitive material (e.g., photoresist) as radiation passes through the mask pattern to the radiation sensitive material. For this reason, the technique is sometimes referred to as "rolling mask" lithography. This nanopatterning technique may make use of Near-Field photolithography, where the mask used to pattern the substrate is in contact with the substrate. Near-Field photolithography implementations of this method may make use of an elastomeric phase-shifting mask, or may employ surface plasmon technology, where the rotating mask surface includes metal nano holes or nanoparticles. In one implementation such a mask may be a near-field phase-shift mask. Near-field phase shift lithography involves exposure of a radiation-sensitive material layer to ultraviolet (UV) light that passes through an elastomeric phase mask while the mask is in conformal contact with a radiation-sensitive material. Bringing an elastomeric phase mask into contact with a thin layer of radiation-sensitive material causes the radiation-sensitive material to "wet" the surface of the contact surface of the mask. Passing UV light through the mask while it is in contact with the radiation-sensitive material exposes the radiation-sensitive material to the distribution of light intensity that develops at the surface of the mask.

In some implementations, a phase mask may be formed with a depth of relief that is designed to modulate the phase of the transmitted light by $\pi$ radians. As a result of the phase modulation, a local null in the intensity appears at step edges in the relief pattern formed on the mask. When a positive radiation-sensitive material is used, exposure through such a mask, followed by development, yields a line of radiation-sensitive material with a width equal to the characteristic width of the null in intensity. For 365 nm (Near UV) light in combination with a conventional radiation-sensitive material, the width of the null in intensity is approximately 100 nm. A polydimethylsiloxane (PDMS) mask can be used to form a conformal, atomic scale contact with a layer of radiation-sensitive material. This contact is established spontaneously upon contact, without applied pressure. Generalized adhesion forces guide this process and provide a simple and convenient method of aligning the mask in angle and position in the direction normal to the radiation-sensitive material surface, to establish perfect contact. There is no physical gap with respect to the radiation-sensitive material. PDMS is transparent to UV light with wavelengths greater than 300 nm. Passing light from a mercury lamp (where the main spectral lines are at 355-365 nm) through the PDMS while it is in conformal contact with a layer of radiation-sensitive material exposes the radiation-sensitive material to the intensity distribution that forms at the mask.

Another implementation of the rotating mask may include surface plasmon technology in which a metal layer or film is laminated or deposited onto the outer surface of the rotatable mask. The metal layer or film has a specific series of through nanoholes. In another embodiment of surface plasmon technology, a layer of metal nanoparticles is deposited on the transparent rotatable mask's outer surface, to achieve the surface plasmons by enhanced nanopatterning.

The abovementioned applications may each utilize a rotatable mask. The rotatable masks may be manufactured with the aid of a master mold (fabricated using one of known nanolithography techniques, like e-beam, Deep UV, Interference and Nanoimprint lithographies). The rotatable masks may be made by molding a polymer material, curing the polymer to form a replica film, and finally laminating the replica film onto the surface of a cylinder. Unfortunately, this method unavoidably would create some "macro" stitching lines between pieces of polymer film (even if the master is very big and only one piece of polymer film is required to cover entire cylinder's surface one stitching line is still unavoidable).

Thus, there is a need in the art to produce a master mask that is capable of producing replicas that do not have stitching lines.

SUMMARY

Aspects of the present disclosure describe a mold and methods for manufacturing molds that may be useful in the fabrication of lithography masks, for example, near-field optical lithography masks for "Rolling mask" lithography, or masks for nanoimprint lithography. In rolling mask lithography, a cylindrical mask is coated with a polymer, which is patterned with desired features in order to obtain a mask for phase-shift lithography or plasmonic printing. The features that are patterned into the polymer may be patterned through the use of the molds described in the present application. The molds may include patterned features that protrude from an interior surface of an optically transparent cylinder. The protruding features may range in size from about 1 nanometer to about 100 microns, preferably from about 10 nanometers to about 1 micron, more preferably from about 50 nanometers to about 500 nanometers. The mask can be used to print features ranging in size from about 1 nanometer to about 1000 nanometers, preferably about 10 nanometers to about 500 nanometers, more preferably about 50 nanometers to about 200 nanometer A first aspect of the present disclosure describes a mold that may be made with a porous mask. A layer of structured porous material may be deposited or grown on an interior surface of an optically transparent cylinder. One example of grown porous material is a porous alumina fabricated using anodization of aluminum layer (Anodized Aluminum Oxide—AAO). The interior of the cylinder may then be coated with a radiation-sensitive material. The radiation-sensitive material will fill in the pores that are formed in the structured porous material. The radiation-sensitive material may then be developed by exposing the exterior of the cylinder with a light source. Exposure from the exterior allows the radiation-sensitive material that has filled the pores to be cured without curing the remaining resist. The uncured resist and the porous mask material may be removed, thereby forming a mold that has posts extruding from its interior surface.

According to an additional aspect of the present disclosure, an epitaxial layer may be grown on the interior surface of the cylinder. Structured porous material may then be deposited or otherwise formed on the epitaxial layer. The epitaxial layer may then be grown using the pores in the porous layer as a guide. The epitaxial layer may be grown to a thickness greater than the structured porous layer, or the structured porous layer may be etched back to leave the epitaxial post behind. According to certain aspects of the present disclosure, the epitaxial material may be a semiconductor material. Each of the epitaxial posts may be configured to be a light emitting diode (LED). The LED posts may further be configured to be individually addressable such that radiation may be selectively produced by individual posts.

According to an additional aspect of the present disclosure, the mold may be formed with a self-assembled monolayer of nanospheres. The monolayer may be formed over a layer of radiation-sensitive material that has been formed on the interior surface of a cylinder. The radiation-sensitive material may then be exposed by a light source located in the interior of the cylinder. The self-assembled monolayer masks portions of the radiation-sensitive material during exposure. The exposed regions may then be removed by a developer. The radiation-sensitive material that was shielded by the self-assembled monolayer may then be cured and in order to form posts that are made from a glass-like substance.

According to an additional aspect of the present disclosure, a self-assembled monolayer of nanospheres formed may comprise quantum dots. The quantum dots may be formed over a layer of radiation-sensitive material that has been formed on the interior surface of a cylinder. The quantum dots may be used to expose the radiation-sensitive material directly below each dot. As such, there may be no need for an external light source. The developer may then remove the unexposed portions of the radiation-sensitive material. The exposed portions of the radiation-sensitive material may then be cured to form a glass-like substance.

According to an additional aspect of the present disclosure, a self-assembled monolayer of nanospheres may be formed on the exterior surface of the cylinder and a radiation-sensitive material may be formed on the interior surface of the cylinder. A light source positioned outside of the cylinder may be used to produce the radiation that exposes the radiation-sensitive material. The nanospheres may mask portions of the radiation-sensitive material from the radiation. The exposed portions may be removed with a developer, thereby leaving behind posts. The posts may be cured to produce a glass-like material.

According to an additional embodiment of the present invention the self-assembled monolayer may comprise quantum dots. The quantum dots may be formed on an exterior surface of a cylinder. The quantum dots may be used to expose portions of a radiation-sensitive material that has be formed on an interior surface of the cylinder. As such, there may be no need for an external light source. The developer may then remove the unexposed portions of the radiation-sensitive material. The exposed portions of the radiation-sensitive material may then be cured to form a glass-like substance. The radiation-sensitive material that has been formed on the interior surface of a cylinder.

BRIEF DESCRIPTION OF THE DRAWINGS

FIGS. 4A-4D are schematic diagrams that show the process of forming the master mold according to additional aspects of the present disclosure that utilize an epitaxial seed layer.

FIGS. 6A,6B,6B',6C are schematic diagrams that show the process of forming the master mold according to additional aspects of the present disclosure that utilize self-assembled monomers formed on the exterior surface of the master mold.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," "above", "below", etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
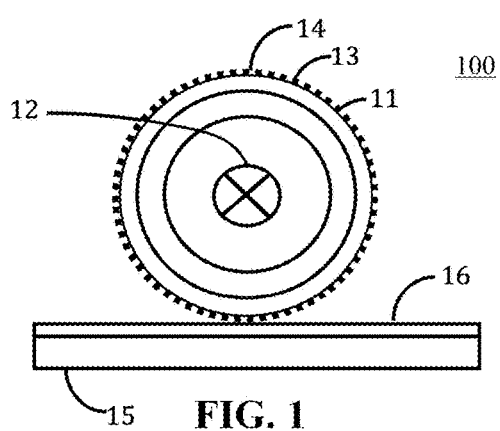
FIG. 1 is a schematic diagram illustrating "Rolling mask" near-field nano lithography.

A "Rolling mask" near-field nanolithography system has been described in International Patent Application Publication Number WO2009094009, which has been incorporated herein by reference. One of the embodiments is shown in FIG. 1. The "rolling mask" consists of glass (e.g., fused silica) frame in the shape of hollow cylinder 11, which contains a light source 12. An elastomeric film 13 laminated on the outer surface of the cylinder 11 has a nanopattern 14 fabricated in accordance with the desired pattern. The rolling mask is brought into a contact with a substrate 15 coated with radiation-sensitive material 16.

A nanopattern 14 can be designed to implement phase-shift exposure, and in such case is fabricated as an array of nanogrooves, posts or columns, or may contain features of arbitrary shape. Alternatively, nanopattern can be fabricated as an array or pattern of nanometallic islands for plasmonic printing. The nanopattern on the rolling mask can have features ranging in size from about 1 nanometer to about 100 microns, preferably from about 10 nanometers to about 1 micron, more preferably from about 50 nanometers to about 500 nanometers. The rolling mask can be used to print features ranging in size from about 1 nanometer to about 1000 nanometers, preferably about 10 nanometers to about 500 nanometers, more preferably about 50 nanometers to about 200 nanometers.

The nanopattern 14 on the cylinder 11 may be manufactured with the use of a master mold. Aspects of the present disclosure describe the master methods and methods for forming a mold that has features that will form a nanopattern 14 that has holes or depressions. In order to form holes or depressions in the rolling mask, the master mold may have protrusions, such as posts.

Figure 2:
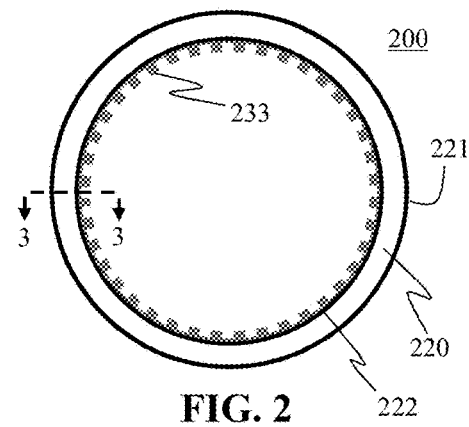
FIG. 2 is an overhead view of a cylinder master mold with protrusions extending out from the interior surface according to an aspect of the present disclosure.

FIG. 2 is an overhead view of a master mold 200 according to an aspect of the present disclosure. The master mold 200 is a hollow cylinder 220 that has an exterior surface 221 and an interior surface 222. The cylinder 220 may be made from a material that is transparent to radiation that is in the visible and/or ultraviolet wavelengths. By way of example, and not by way of limitation, the cylinder may be a glass such as fused silica. The master mold 200 has protrusions 233 that extend inwards from the interior surface 222 toward an interior of the cylinder 220, e.g., extending from the interior surface 222 towards a central axis of the cylinder.

FIGS. 3A-3G are cross sectional views of the master mold 200 as seen along the line 3-3 shown in FIG. 2. Each figure depicts a processing step used in the fabrication of the master mold 200 according to aspects of the present disclosure.

Figure 3A:
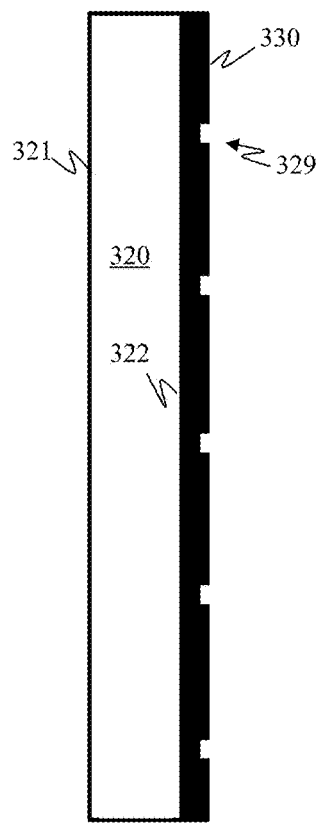
FIGS. 3A-3G are schematic diagrams that show the process of forming the master mold according to aspects of the present disclosure.

FIG. 3A is a depiction of the master mold after a structured porous layer 330 on an interior surface of the cylinder 320. By way of example, and not by way of limitation, the, cylinder 320 may be made of a transparent material, such as fused silica. It is noted that fused silica is commonly referred to as "quartz" by those in the semiconductor fabrication industry. Although quartz is common parlance, "fused silica" is a better term. Technically, quartz is crystalline and fused silica is amorphous. The structured porous layer 330 contains a high density of cylindrical pores 329 that are aligned perpendicular to the surface on which the structured porous layer is disposed. The size and density of the pores 329 may be in any range suitable for the desired features of the mask pattern, e.g., as discussed above with respect to FIG. 2. By way of Example and not by way of limitation, the nanostructured porous layer 330 may be a layer of anodic aluminum oxide (AAO) that has been formed on an interior surface 322 of the cylinder 320. AAO is a self-organized nanostructured material containing a high density of cylindrical pores that are aligned perpendicular to the surface on which the AAO layer is disposed. The AAO may be formed by depositing a layer of aluminum on the interior surface 322 of a cylinder 320 made of fused silica and then anodizing the aluminum layer. Alternatively, the cylinder 320 may be made completely from aluminum, and then internal or external surfaces of such a cylinder could be anodized to form a porous surface. Anodizing the aluminum layer may be done by passing an electric current through an electrolyte (often an acid) with the aluminum layer acting as a positive electrode (anode).

In alternative implementations, the nanostructured porous layer may be fabricated using a self-assembled monolayer or by direct writing techniques, such as laser ablation or ion beam lithography.

Figure 3B:
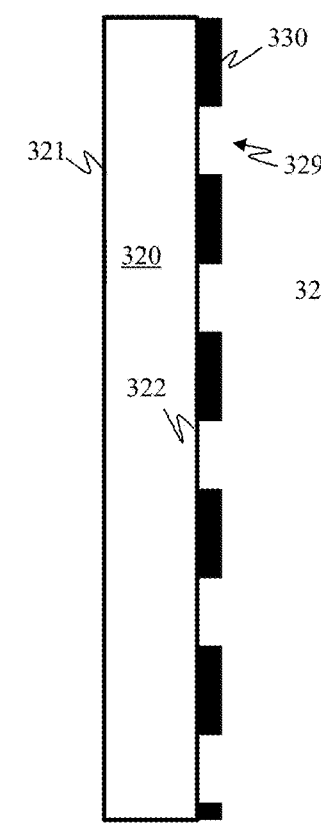

As shown in FIG. 3A, the pores 329 may not penetrate through the entire depth of the layer 330. If the pores 329 do not extend through the structured porous layer 330 down to the interior surface 322 of the cylinder, the material of the structured porous layer may be etched back with an etch process. If the etch process is isotropic, the original size of the pores 329 must be made small enough to account for growth during the etching process. For example, if the final diameter of the pores is desired to be 300 nm, and the original diameter of the pores 329 is 50 nm, then the isotropic etch must remove 125 nm of porous material in order to enlarge the diameter of the pores 329 to 300 nm. Additionally, if the etch process is isotropic, only 125 nm of material may be removed from the bottom of the pore in order to extend the pore to the interior surface 322 of the cylinder. If more material needs to be removed in order to reach the interior surface 322, then the diameter of the pores 329 may become larger than desired. FIG. 3B depicts the enlarged pores 329 that completely extend through the nanostructured porous layer 330.

Figure 3C:
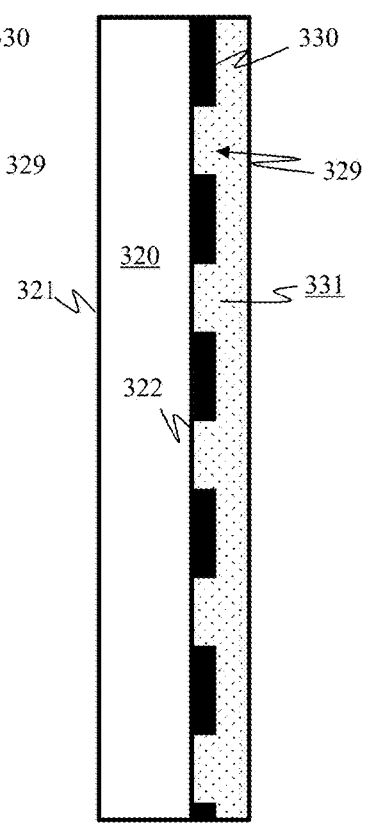

After the pores 329 have been etched to the proper dimensions and depths, a radiation-sensitive material 331 may be deposited over the nanostructured porous layer 330 and the exposed portions of the interior surface 322, as shown in FIG. 3C. By way of example, and not by way of limitation, the radiation-sensitive material 331 may be deposited by dipping, spraying, rolling, or any combination thereof. By way of example, and not by way of limitation, the radiation-sensitive material 331 may be a photoresist or a UV curable polymer. Examples of suitable photoresists include commercially available formulations such as TOK iP4300 or Shipley 1800 series from Dow Chemical Co. Examples of suitable UV-curable materials include UV polymerizable adhesives for polymers and glass. Additionally, the radiation-sensitive material 331 contains silicon and other constituents that enable the material to be annealed after it has cured in order to produce a glass-like material. Other constituents that may be used to help form the glass-like material include Oxygen and Silicon. The radiation-sensitive material 331 may be a solid film, or it may be a liquid layer as long as it does not flow excessively during exposure.

Figures 3D, 3E, 3F, 3G:
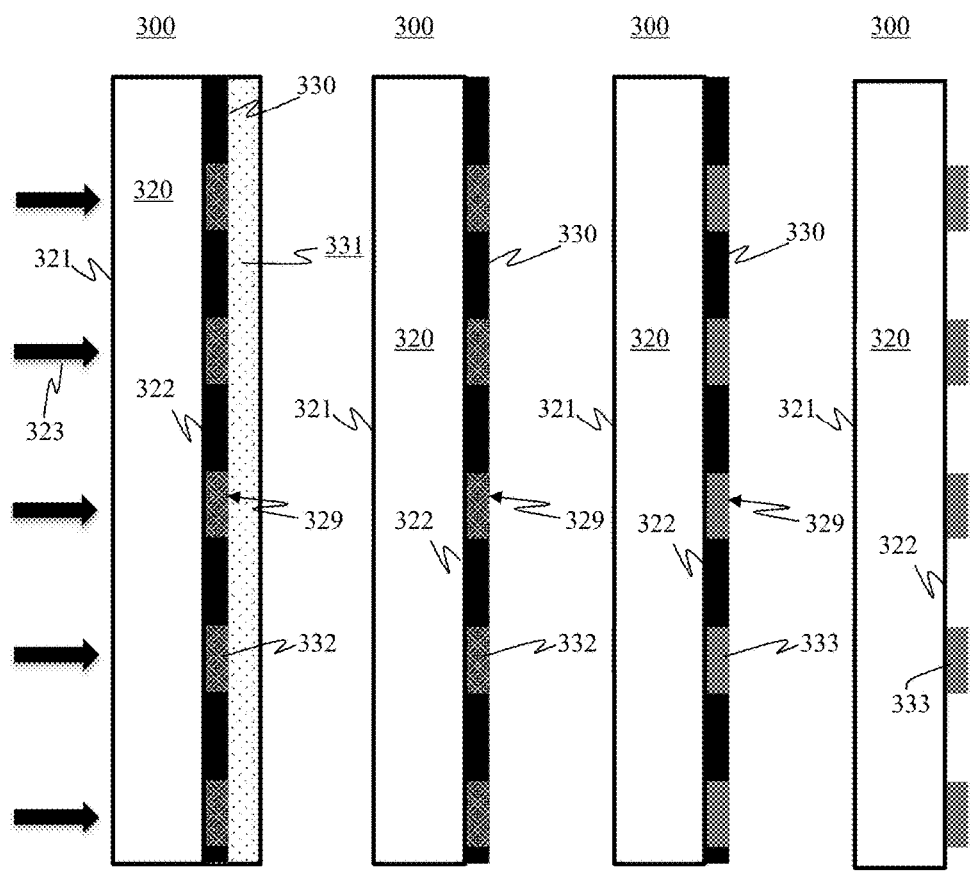

Next, FIG. 3D shows the cured material 332 in the pores 329. The radiation-sensitive material 331 is cured by exposure to a radiation 323 from a radiation source (not shown). By way of example, and not by way of limitation, the radiation 323 may be produced by a radiation source that produces ultraviolet light or the radiation 323 may be produced by a radiation source that produces light in the visible spectrum. The radiation source may be located outside of the cylinder and may emit radiation 323 that passes through the wall of the cylinder 320. The illumination through the cylinder 320 limits the exposure to the material 331 deposited in the AAO pores 329. Additionally, the exposure cures the material 331 to a depth of roughly twice the exposure wavelength. By way of example, when an ultraviolet wavelength is used for curing, then the cured material 332 may have a thickness of approximately 600 nm.

The curing sensitivity of the radiation-sensitive material 331 must be sufficiently high to allow the radiation-sensitive material inside the pores 329 to be cured before the material 331 above the pores 329 is cured. Also, the depth of the pores 329 may be greater than the projected thickness of the cured material 332 in order to prevent exposure of the radiation-sensitive material 331 directly above the pores 329.

FIG. 3E shows the master mold 300 after the excess radiation-sensitive material has been removed after the cured material 332 has been formed. The remaining unexposed radiation-sensitive material 321 may be removed with a developer or other solvent. Thereafter, as shown in FIG. 3F, the cured material 332 is annealed in order to form a glass-like material 333. Finally, once the annealing is completed, the AAO layer 330 may be selectively etched away with a wet etching process. FIG. 3G depicts the final structure of the master mold 300. The glass-like material 333 protrudes from the interior surface 322 of the cylinder 320.

According to an additional aspect of the present disclosure, the protrusions may be formed through an epitaxial growth process. FIG. 4A is an overhead view of a master mold 400. The master mold 400 is a hollow cylinder 420 that has an exterior surface 421 and an interior surface 422. The cylinder 420 may be made from a material that is transparent to radiation that is in the visible and/or ultraviolet wavelengths. By way of example, and not by way of limitation, the cylinder may be a glass such as fused silica. An epitaxial seed layer 424 may be formed on the interior surface 422. By way of example, and not by way of limitation, the epitaxial seed layer 424 may be a semiconductor material such as silicon or gallium arsenide (GaAs). The master mold 400 has protrusions 433 that extend outwards from the epitaxial seed layer 424. The protrusions may be the same material as the epitaxial seed layer 424. FIGS. 4B-4D are cross-sectional views of the master mold 400 along the line 4-4.

FIG. 4B is a depiction of a structured porous layer 430 that is deposited over the epitaxial seed layer 424. As shown in FIG. 4B, the pores 429 might not penetrate through the entire depth of the structured porous layer 430.

When the pores 429 do not extend through the structured porous layer 430 down to the epitaxial seed layer 424, then the structured porous layer material may be etched back with an etch process. If the etch process is isotropic, the original size of the pores 429 must be made small enough to account for growth during the etching process. For example, if the final diameter of the pores is desired to be 300 nm, and the original diameter of the pores 329 is 50 nm, then the isotropic etch must remove 125 nm of aluminum in order to enlarge the diameter of the pores 429 to 300 nm. Additionally, if the etchant is an isotropic etchant, only 125 nm of material may be removed from the bottom of the pore in order to extend the pore to the epitaxial seed layer 424. If more material needs to be removed in order to reach the epitaxial seed layer 424, then the diameter of the pores 429 may become larger than desired. FIG. 4C depicts the enlarged pores 429 that completely extend through the structured porous layer 430.

Once the pores 429 have been completed, the protrusions 433 may be formed with an epitaxial growth process, such as, but not limited to vapor-phase epitaxy (VPE). The growth of the protrusions 433 is guided by the pores 429 in the structured porous layer 430. The protrusions 433 may be grown to a height that allows them to protrude beyond the structured porous layer 430. However, the protrusions 433 may be shorter than the structured porous layer 430, if the structured porous layer will be subsequently etched back in order to expose the protrusions 433.

According to aspects of the present disclosure, protrusion 433 formed through epitaxial growth of a semiconductor material may further be configured to be LEDs. Each of the protrusions 433 may be individually addressable such that each may be controlled to emit light as desired. This is beneficial for use as a master mold, because the molding process no longer requires an external light source. The protrusions 433 may function as a physical mold, and may be used to cure the photomask that is being molded at the same time. Further, the ability to control individual protrusions allows for a single master mold to be utilized in order to form multiple different patterns by selecting which protrusions will also cure the material in the photomask.

Figures 5A, 5B, 5C:
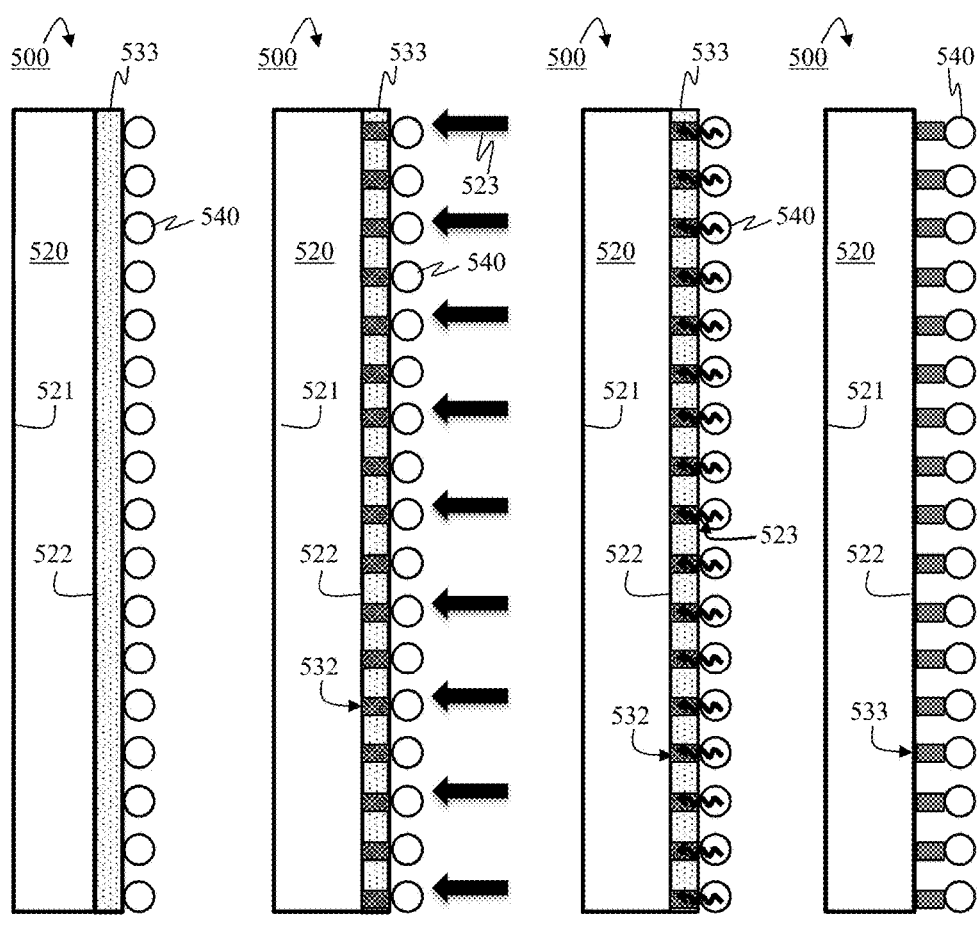
FIGS. 5A,5B,5B',5C are schematic diagrams that show the process of forming the master mold according to additional aspects of the present disclosure that utilize self-assembled monomers formed on the interior of the master mold.

According to yet another additional aspect of the present disclosure, a self-assembled monolayer may be used as a mask to pattern the protrusions 533 in a master mold 500. FIGS. 5A-5C are cross-sectional views of a master mold 500 at different processing steps during the mold's fabrication. FIG. 5A depicts the formation of a self-assembled monolayer (SAM) 540 formed over a radiation-sensitive material 531 on the interior surface 522 of the cylinder 520. By way of example, and not by way of limitation, the SAM 540 may be formed from metal nanospheres, or quantum dots. By way of example, and not by way of limitation, the radiation-sensitive material 531 may be photoresist or a UV curable polymer. Additionally, the radiation-sensitive material 531 contains silicon and other constituents that enable the material to be annealed in order to produce a glass-like material.

Next, at FIG. 5B, the radiation-sensitive material 531 is exposed with radiation 523 from a radiation source (not shown). Plasmonic lithography may be utilized, e.g., if the SAM 540 comprises metal nanospheres. The metal nanospheres may be used as plasmonic mask antennae. The portions of the radiation-sensitive material 531 that are exposed to radiation may become soluble to a developer solvent used to develop the radiation-sensitive material. The portion of the radiation-sensitive material that is unexposed 532 may remain insoluble to the developer solvent. It is noted that alternative aspects of the present disclosure include use of a reverse tone process in which portions of the radiation-sensitive material 531 that are exposed to radiation become insoluble to a developer and portions of the radiation-sensitive material that are not so exposed remain soluble to the developer. Alternative aspects of the present disclosure where the SAM 540 comprises quantum dots may not need an additional light source to expose the radiation-sensitive material 531. As shown in FIG. 5B' the quantum dots in the SAM 540 may be activated in order to expose the radiation-sensitive material 531. When the exposure is made by the quantum dots, the radiation-sensitive material may be cured by the exposure. The non-exposed portions of the radiation-sensitive material 531 may therefore be removed by the developer. Finally, in FIG. 5C the protrusions 533 are annealed in order to convert the cured radiation-sensitive material 532 into glass-like material.

Alternative aspects of the present disclosure include implementations in which the mask itself is made with light emitting diodes (LEDs). Such a mask may be implemented, e.g., using a polymer mask with an array of holes smaller than features that are desired to be printed, with a corresponding layer of LEDs above it. A specific subset of the LEDs may be turned on to define the pattern to be printed.

According to an additional aspect of the present disclosure, a SAM 640 may be formed on the exterior surface 621 of the cylinder 620 as show in FIG. 6A. The SAM 640 may be substantially similar to the SAM 540. The formation of a SAM 640 on the exterior surface allows for the light used for the exposure to originate from outside of the cylinder 620 as shown in FIG. 6B. In FIG. 6B, the radiation-sensitive material 631 may be exposed with radiation 623 that is emitted by a radiation source (not shown) that is located outside of the cylinder 620. Alternatively, if the SAM 640 comprises quantum dots, then the radiation source that produces the radiation 623 may be omitted, and the quantum dots may be used to expose the radiation-sensitive material 631 instead, as shown in FIG. 6B'. Finally, FIG. 6C shows the removal of the non-exposed radiation-sensitive material, and the annealing of the protrusions 633 to form the glass-like material.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A method for forming a master mold for a cylindrical lithography mask, comprising:
    forming a structured porous layer over an interior surface of a cylinder, wherein the cylinder is transparent to optical radiation;
    filling one or more pores in the structured porous layer with a filling material;
    removing portions of the filling material that are not in one of the one or more pores; and
    forming one or more protrusions from the filling material in the one or more pores, wherein the protrusions are formed by using the one or more pores as guide for growth, wherein a length of the protrusions extends beyond the structured porous layer, wherein the one or more protrusions protrude inward from the interior surface of the cylinder towards an interior of the cylinder.

2. The method of claim 1, wherein the filling material is a radiation-sensitive material.

3. The method of claim 2, wherein the step of removing the portions of the filling material that are not in one of the one or more pores comprises:
    exposing an outside surface of the cylinder with radiation for a sufficient length of time to cure the radiation-sensitive material that is in the one or more pores of the structured porous layer; and
    developing the radiation-sensitive material with a developer configured to remove portions of the radiation-sensitive material that have not been cured.

4. The method of claim 3, wherein the radiation-sensitive material further comprises silicon.

5. The method of claim 4 further comprising:
    annealing the cured radiation-sensitive material.

6. The method of claim 2, wherein forming the one or more protrusions comprises etching away at least a portion of the structured porous layer.

7. The method of claim 1, wherein the interior surface of the cylinder is an epitaxial seed layer.

8. The method of claim 7, wherein the filling material is an epitaxial growth of the epitaxial seed layer.

9. The method of claim 8, wherein the epitaxial seed layer is a semiconductor material.

10. The method of claim 9, wherein each of the one or more protrusions is configured to act as a light emitting diode (LED), whereby there are one or more LEDs.

11. The method of claim 10, wherein each of the one or more LEDs are configured to selectively and individually emit light.

12. The method of claim 8, wherein allowing the filling material in the one or more pores to form one or more protrusions that extend lengthwise beyond the structured porous layer comprises growing the epitaxial growth beyond a thickness of the structured porous layer.

13. The method of claim 1, wherein the one or more protrusions have a feature size between 1 nanometer and 100 microns.

14. The method of claim 1, wherein the one or more protrusions have a feature size between 10 nanometers and 1 micron.

15. The method of claim 1, wherein the one or more protrusions have a feature size between 50 nanometers and 500 nanometers.

* * * * *